(12) United States Patent
Yang et al.

(10) Patent No.: US 12,063,755 B2
(45) Date of Patent: Aug. 13, 2024

(54) LATCH MECHANISM AND SERVER ASSEMBLY AND RACK-MOUNT SERVER SYSTEM EMPLOYING SAME

(71) Applicant: Delta Electronics, Inc., Taoyuan (TW)

(72) Inventors: Ming-Tang Yang, Taoyuan (TW); Wei-Chung Chen, Taoyuan (TW); Yu-Hao Shen, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 8 days.

(21) Appl. No.: 17/557,684

(22) Filed: Dec. 21, 2021

(65) Prior Publication Data

US 2022/0400571 A1 Dec. 15, 2022

Related U.S. Application Data

(60) Provisional application No. 63/209,823, filed on Jun. 11, 2021.

(30) Foreign Application Priority Data

Sep. 3, 2021 (CN) .......................... 202111030472.8

(51) Int. Cl.
*H05K 5/02* (2006.01)
*F16L 37/00* (2006.01)
(Continued)

(52) U.S. Cl.
CPC .......... *H05K 7/1409* (2013.01); *F16L 37/008* (2013.01); *F16L 37/127* (2013.01);
(Continued)

(58) Field of Classification Search
CPC ............... H05K 7/1409; H05K 7/1489; H05K 7/20218; H05K 7/20272; H05K 7/20763;
(Continued)

(56) References Cited

U.S. PATENT DOCUMENTS

| 5,078,429 A | 1/1992 | Braut et al. | |
|---|---|---|---|
| 5,316,347 A * | 5/1994 | Arosio | F16L 37/56 285/85 |

(Continued)

FOREIGN PATENT DOCUMENTS

| CN | 102573384 A | 7/2012 |
|---|---|---|
| CN | 208368882 U | 1/2019 |

(Continued)

*Primary Examiner* — Adrian S Wilson
*Assistant Examiner* — Gage Crum
(74) *Attorney, Agent, or Firm* — KIRTON McCONKIE; Evan R. Witt

(57) ABSTRACT

The present disclosure provides a latch mechanism, applied to a rack-mount server system. The rack-mount server system includes a server and a manifold, and the server includes a casing and a fluid connector. The manifold includes a manifold connector. The latch mechanism includes a fixing member, a fixing frame and a hook member. The fixing member is disposed on the manifold and includes a fixing pin. The fixing frame is secured to the server and includes a shaft. The hook member is rotatably disposed on the shaft and includes a hook portion. By rotating the hook portion to latch with the fixing pin, the fixing frame and fixing member are secured with each other, and the fluid connector of the server is coupled to and in fluid communication with the manifold connector of the manifold.

12 Claims, 12 Drawing Sheets

(51) Int. Cl.
*F16L 37/127* (2006.01)
*F16L 41/08* (2006.01)
*H05K 7/14* (2006.01)
*H05K 7/20* (2006.01)

(52) U.S. Cl.
CPC ............ F16L 41/08 (2013.01); H05K 5/0221 (2013.01); H05K 7/1489 (2013.01); H05K 7/20272 (2013.01); H05K 7/20781 (2013.01)

(58) Field of Classification Search
CPC ............ H05K 7/20781; H05K 5/0221; H05K 7/1401; H05K 7/1415; H01R 13/627; H01R 13/6271; H01R 13/6272; H01R 13/6273; H01R 13/6275; H01R 13/629; F16L 37/12; F16L 37/008; F16L 37/127; F16L 41/08

See application file for complete search history.

(56) References Cited

U.S. PATENT DOCUMENTS

| | | | |
|---|---|---|---|
| 5,795,175 A * | 8/1998 | Barr | H01R 13/6275 439/681 |
| 7,578,451 B2 * | 8/2009 | Mueller | B05B 7/22 239/128 |
| 9,668,383 B2 * | 5/2017 | Cox | H05K 7/20272 |
| 10,178,801 B2 | 1/2019 | Liu et al. | |
| 11,064,628 B2 * | 7/2021 | Thibaut | H05K 7/20772 |
| 11,553,627 B1 * | 1/2023 | Gregory | H05K 7/20781 |
| 2004/0074541 A1 * | 4/2004 | Sharpe | F16L 37/121 137/614.04 |
| 2008/0273307 A1 | 11/2008 | Campbell et al. | |
| 2015/0077930 A1 * | 3/2015 | Kadotani | H05K 7/20781 361/679.53 |
| 2017/0079161 A1 * | 3/2017 | Tasi | G06F 1/20 |
| 2020/0146173 A1 * | 5/2020 | Hsu | H05K 7/183 |
| 2021/0270056 A1 * | 9/2021 | Tower | E05B 9/02 |

FOREIGN PATENT DOCUMENTS

| | | |
|---|---|---|
| CN | 112020264 A | 12/2020 |
| TW | M604539 U | 11/2020 |
| WO | 2015010530 A1 | 1/2015 |
| WO | WO-2022047360 A1 * 3/2022 ............... H05K 7/20 |

\* cited by examiner

LATCH MECHANISM AND SERVER ASSEMBLY AND RACK-MOUNT SERVER SYSTEM EMPLOYING SAME

CROSS-REFERENCE TO RELATED APPLICATION

This application claims the benefit of U.S. Provisional Application No. 63/209,823, filed on Jun. 11, 2021, and entitled "LATCH MECHANISM AND SERVER AND RACK-MOUNT SERVER SYSTEM EMPLOYING SAME". This application claims priority to China Patent Application No. 202111030472.8, filed on Sep. 3, 2021. The entireties of the above-mentioned patent applications are incorporated herein by reference for all purposes.

FIELD OF THE INVENTION

The present disclosure relates to a latch mechanism, and more particularly to a latch mechanism for firmly securing a fluid connector of a server to a manifold connector of a manifold assembly. The present disclosure also relates to a server assembly and a rack-mount server system.

BACKGROUND OF THE INVENTION

Nowadays, the liquid cooling system is widely used in a data center or a telecommunication equipment and configured to actively dissipate heat generated by the electronic devices (e.g., servers) disposed within a rack. FIG. 1A is a schematic perspective view showing a liquid cooling system applied to a rack-mount server system according to the prior art, wherein the liquid cooling system includes a server and a manifold assembly. FIG. 1B is a schematic perspective view showing the server, the manifold assembly and a rack of the rack-mount server system of FIG. 1A, wherein the fluid connection between the server and manifold assembly is performed when the server is fixed in the rack by a resilient plate. Generally, the liquid cooling system includes a pump, at least one server 11 and a manifold assembly 12. At least one liquid cooling loop is formed among the pump, the at least one server 11 and the manifold assembly 12. The pump is configured to drive the cooling liquid to flow and circulate within the liquid cooling loop. The server 11 includes a case 111, an inlet fluid connector 112, an outlet fluid connector 113 and a liquid cooling channel 114. The inlet fluid connector 112 and the outlet fluid connector 113 are disposed on the rear plate of the case 111. The liquid cooling channel 114 is disposed in the interior of the case 111 and has two ends connected with the inlet fluid connector 112 and the outlet fluid connector 113, respectively. The manifold assembly 12 includes an inlet manifold 121 and an outlet manifold 122. The inlet manifold 121 is disposed on a rack 13 and configured to couple with the inlet fluid connector 112 of the server 11 for receiving the cooling liquid and allowing the cooling liquid to flow into the liquid cooling channel 114 of the sever 11 through the inlet fluid connector 112. The outlet manifold 122 is disposed on the rack 13 and configured to couple with the outlet fluid connector 113 of the server 11 for discharging the cooling liquid from the liquid cooling channel 114 of the server 11 through the outlet fluid connector 113. Under this circumstance, heat exchange between the cooling liquid and the electronic components of the server 11 is performed to transfer thermal energy away from the server 11 continuously. Consequently, heat dissipation of the server 11 is achieved.

However, it is importance to establish the fluid connection between the server 11 and the manifold assembly 12. Generally, the server 11 includes at least one resilient plate 115. The resilient plate 115 is disposed on the lateral side of the case 111 and located at a position away from the inlet fluid connector 112 and the outlet fluid connector 113. The resilient plate 115 is configured to engage with an engaging part of the rack 13, so that the server 11 is fixed in the rack 13. Meanwhile, the inlet fluid connector 112 and the outlet fluid connector 113 of the server 11 are coupled to the fluid connector of the inlet manifold 121 and the fluid connector of the outlet manifold 122, respectively. Consequently, the resilient plate 115 can fix the inlet fluid connector 112 and the outlet fluid connector 113 of the server 11 to the fluid connectors of the manifold assembly 12.

However, due to the tolerances between the resilient plate 115 of the server 11 and the engaging part of the rack 13 and the tolerances between the frame parts of the rack 13, the inlet fluid connector 112 and the outlet fluid connector 113 of the server 11 cannot be precisely and firmly coupled to the fluid connectors of the manifold assembly 12 when the server 11 is disposed in the rack 13. Under this circumstance, the fluid connection state between the inlet fluid connector 112 of the server 11 and the fluid connector of the inlet manifold 121 is different from the fluid connection state between the outlet fluid connector 113 of the server 11 and the fluid connector of the outlet manifold 122. Uneven flow rate of the cooling liquid is formed, and the leakage and poor circulation of the cooling liquid is caused. Consequently, the heat-dissipation efficiency is impacted.

Moreover, in case that the fluid connectors of the manifold assembly 12 and the fluid connectors 112, 113 of the server 11 are quick-disconnecting fluid connectors, the fluid connectors 112, 113 of the server 11 are blind-mated with the fluid connectors of the manifold assembly 12 without fixing means. When the inlet fluid connector 112 and the outlet fluid connector 113 of the server 11 are coupled to the fluid connectors of the manifold assembly 12, elastic forces F are formed between the fluid connectors of the manifold assembly 12 and the fluid connectors 112, 113 of the server 11. Due to the elastic forces F exerted between the server 11 and the manifold assembly 12, a torque T is generated to exert upon the server 11, so that the server 11 is tilted. Under this circumstance, the inlet fluid connector 112 and the outlet fluid connector 113 of the server 11 cannot be precisely and firmly coupled to the fluid connectors of the manifold assembly 12. The fluid connection state between the inlet fluid connector 112 of the server 11 and the fluid connector of the inlet manifold 121 is different from the fluid connection state between the outlet fluid connector 113 of the server 11 and the fluid connector of the outlet manifold 122. Uneven flow rate of the cooling liquid is formed, and the leakage and poor circulation of the cooling liquid is caused. Consequently, the heat-dissipation efficiency is impacted.

FIG. 2A is a schematic perspective view showing a liquid cooling system applied to a rack-mount server system according to another prior art, wherein the liquid cooling system includes a server and a manifold assembly. FIG. 2B is a schematic perspective view showing the server, the manifold assembly and a rack of the rack-mount server system of FIG. 2A, wherein the fluid connection between the server and manifold assembly is performed when the server is fixed in the rack by a resilient plate. As shown in FIGS. 2A and 2B, in order to avoid torques formed on the server 11, the inlet fluid connector 112 and the outlet fluid connector 113 are disposed on two corresponding sides of the rear plate of the server 11. When the fluid connectors of the manifold assembly 12 are respectively coupled with the inlet fluid connector 112 and the outlet fluid connector 113 of the server 11, the torque formed by the elastic force F between the inlet fluid connector 112 and the mating fluid connector is offset by the torque formed by the elastic force F between the outlet fluid connector 113 and the mating fluid connector. However, even if the torques formed on the server 11 are avoided, the elastic force F between the server 11 and the manifold assembly 12 is still existed, and the rack-mount server system is still under the risk of damage. For example, the plurality of servers 11 includes 44 inlet fluid connectors 112 and 44 outlet fluid connectors 113, and the manifold assembly 12 includes 88 fluid connectors. When the plurality of servers 11 are assembled in the rack 13 and the 44 inlet fluid connectors 112 and the 44 outlet fluid connector 113 are respectively coupled with the 88 fluid connectors of the manifold assembly 12, the total elastic force generated at this time is 3500N (Newton) and directly exerted to the rack 13. Since the rack 13 is usually unable to withstand such a large elastic force, deformations of the rack 13 may be formed, and the rack-mount server system may be damaged.

Therefore, there is a need of providing an improved latch mechanism, a server assembly and a rack-mount server system to obviate the drawbacks of the prior art.

SUMMARY OF THE INVENTION

It is an object of the present disclosure to provide a latch mechanism, a server assembly and a rack-mount server system. The latch mechanism is configured for firmly coupling the fluid connectors of the server to the fluid connectors of the manifold assembly, so that the elastic force exerted between the server and the manifold assembly is offset, the torque exerted upon the server is reduced, the oblique of the server in the slot of a rack and the leakage of the cooling liquid are avoided, the precision of the product is enhanced, and the heat dissipating efficiency is enhanced.

It is an object of the present disclosure to provide a latch mechanism, applied to a rack-mount server system. The rack-mount server system includes at least one server and at least one manifold. The at least one server includes a casing and at least one fluid connector. The at least one manifold includes at least one manifold connector. The latch mechanism includes at least one fixing member, a fixing frame and a hook member. The at least one fixing member is disposed on the at least one manifold and includes at least one fixing pin. The fixing frame is secured to the server and includes a shaft. The hook member is rotatably disposed on the shaft of the fixing frame and includes a hook portion. By rotating the hook portion of the hook member to latch with the at least one fixing pin of the at least one fixing member, the fixing frame and fixing member are secured with each other, and the at least one fluid connector of the at least one server is firmly coupled to and in fluid communication with the at least one manifold connector of the at least one manifold.

It is another object of the present disclosure to provide a server assembly, applied to a rack-mount server system. The rack-mount server system includes at least one manifold. The at least one manifold includes at least one manifold connector. The server assembly includes at least one server and a latch mechanism. The at least one server includes a casing and at least one fluid connector. The at least one fluid connector is disposed on a side of the casing. The latch mechanism includes at least one fixing member, a fixing frame and a hook member. The at least one fixing member is disposed on the at least one manifold and includes at least one fixing pin. The fixing frame is secured to the casing of the server and includes a shaft. The hook member is rotatably disposed on the shaft of the fixing frame and includes a hook portion. By rotating the hook portion of the hook member to latch with the at least one fixing pin of the at least one fixing member, the fixing frame and fixing member are secured with each other, and the at least one fluid connector of the at least one server is firmly coupled to and in fluid communication with the at least one manifold connector of the at least one manifold.

It is a further object of the present disclosure to provide a rack-mount server system. The rack-mount server system comprises a rack, a manifold assembly, at least one server and a latch mechanism. The manifold assembly is detachably disposed on the rack and includes at least one manifold. The at least one manifold includes at least one manifold connector. The at least one server is detachably disposed in the rack and includes a casing and at least one fluid connector. The at least one fluid connector is disposed on a side of the casing. The latch mechanism includes at least one fixing member, a fixing frame and a hook member. The at least one fixing member is disposed on the at least one manifold and includes at least one fixing pin. The fixing frame is secured to the casing of the server and includes a shaft. The hook member is rotatably disposed on the shaft of the fixing frame and includes a hook portion. By rotating the hook portion of the hook member to latch with the at least one fixing pin of the at least one fixing member, the fixing frame and fixing member are secured with each other, and the at least one fluid connector of the at least one server is firmly coupled to and in fluid communication with the at least one manifold connector of the at least one manifold.

BRIEF DESCRIPTION OF THE DRAWINGS

The above contents of the present invention will become more readily apparent to those ordinarily skilled in the art after reviewing the following detailed description and accompanying drawings, in which.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
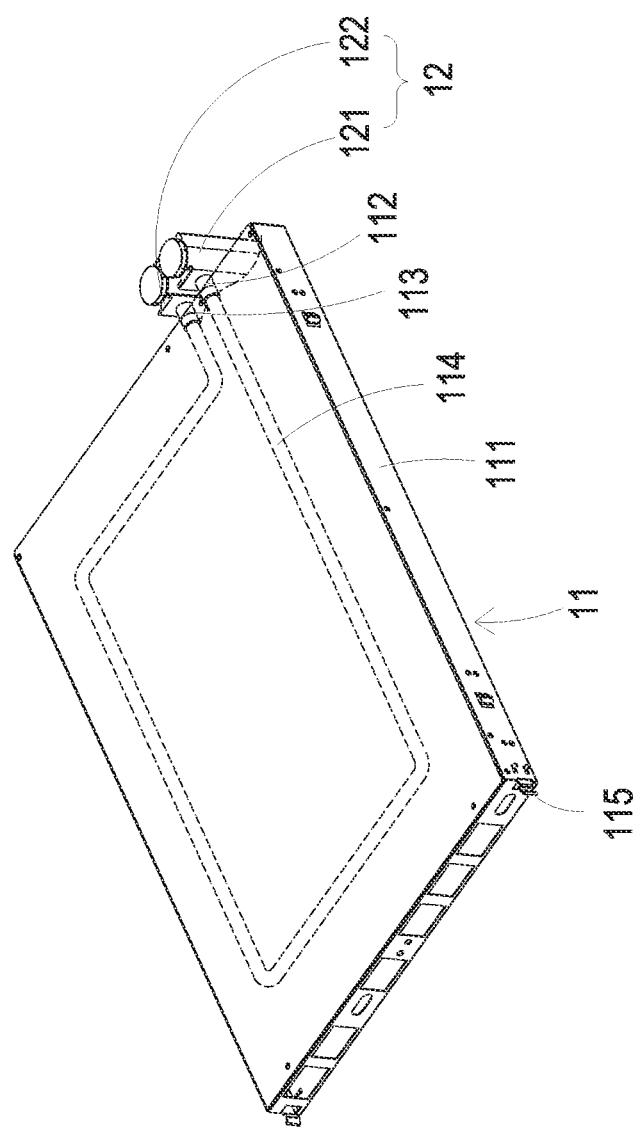
FIG. 1A is a schematic perspective view showing a liquid cooling system applied to a rack-mount server system according to the prior art, wherein the liquid cooling system includes a server and a manifold assembly.
Figure 1B:
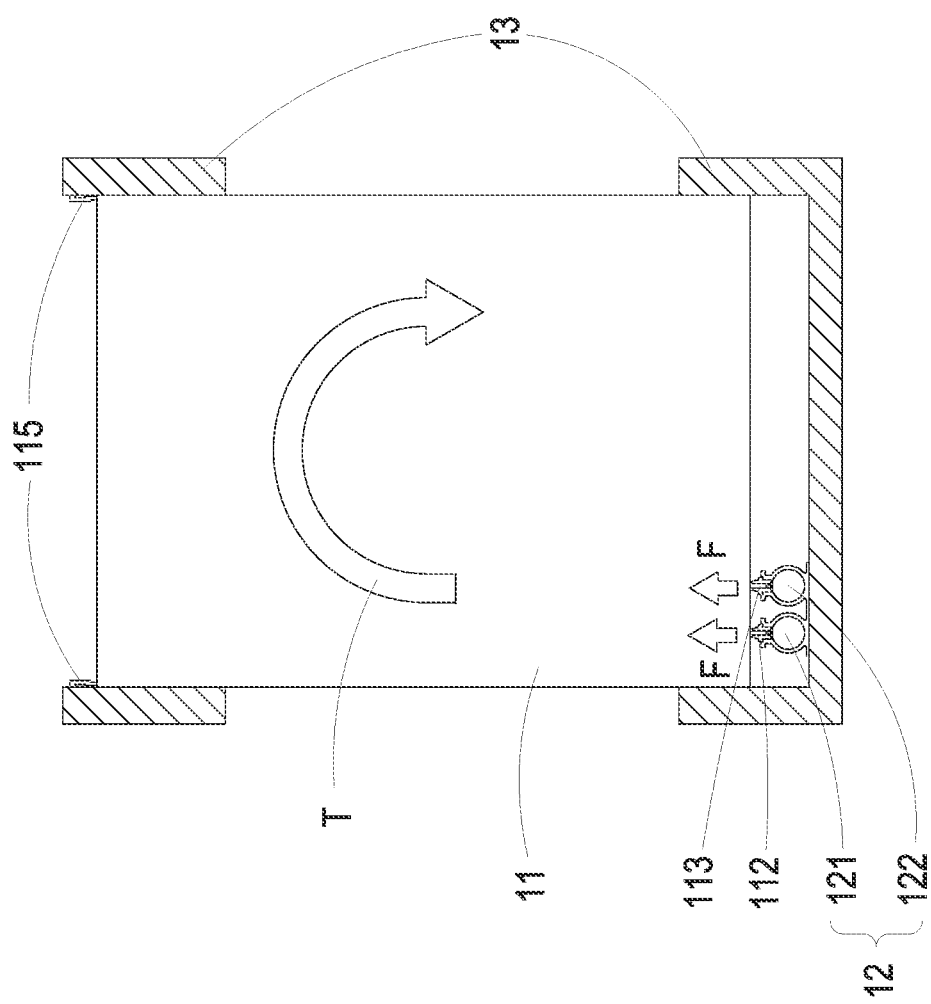
FIG. 1B is a schematic perspective view showing the server, the manifold assembly and a rack of the rack-mount server system of FIG. 1A, wherein the fluid connection between the server and manifold assembly is performed when the server is fixed in the rack by a resilient plate.
Figure 2A:
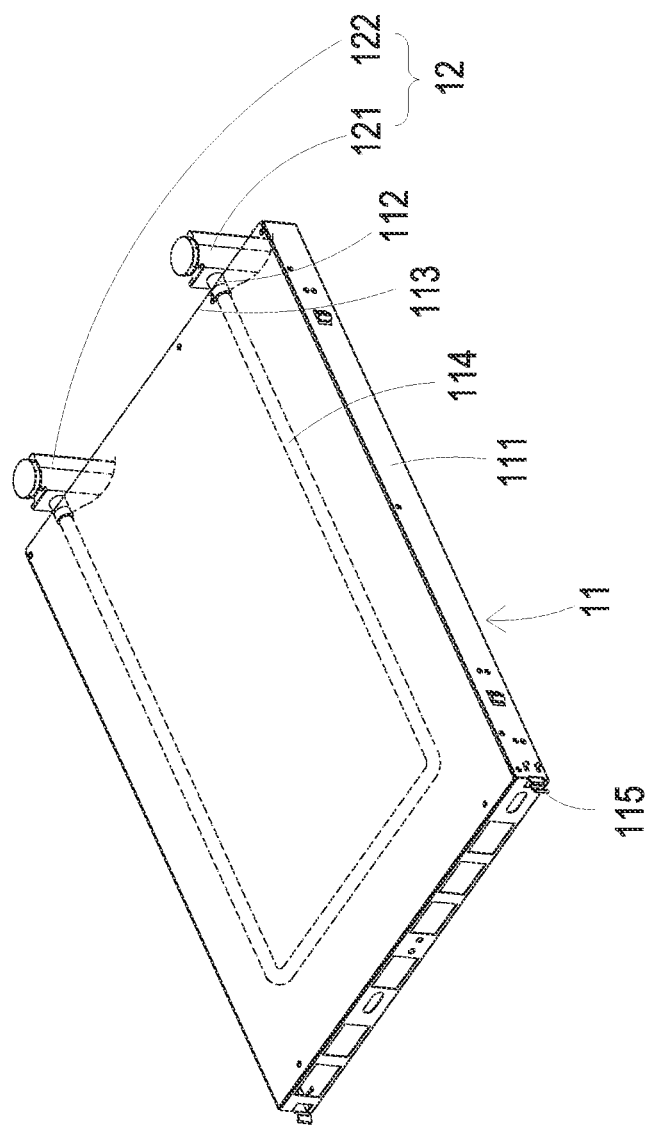
FIG. 2A is a schematic perspective view showing a liquid cooling system applied to a rack-mount server system according to another prior art, wherein the liquid cooling system includes a server and a manifold assembly.
Figure 2B:
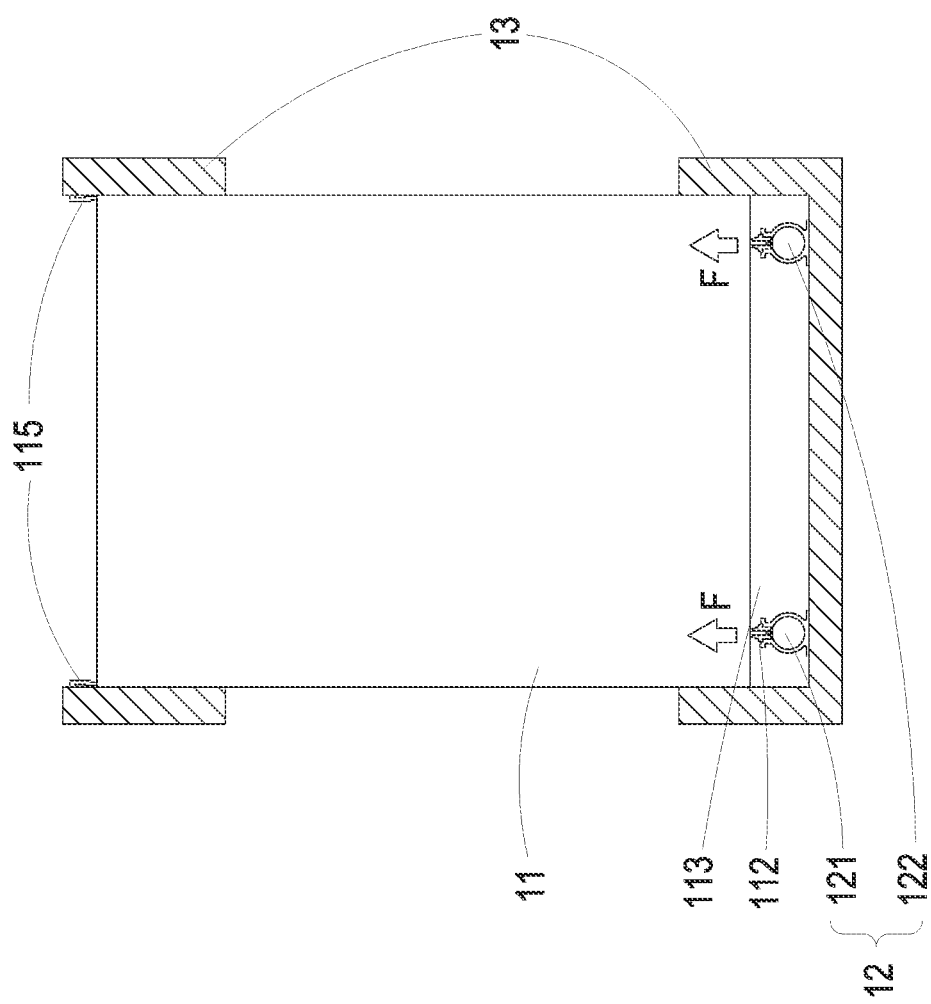
FIG. 2B is a schematic perspective view showing the server, the manifold assembly and a rack of the rack-mount server system of FIG. 2A, wherein the fluid connection between the server and manifold assembly is performed when the server is fixed in the rack by a resilient plate.
Figure 3:
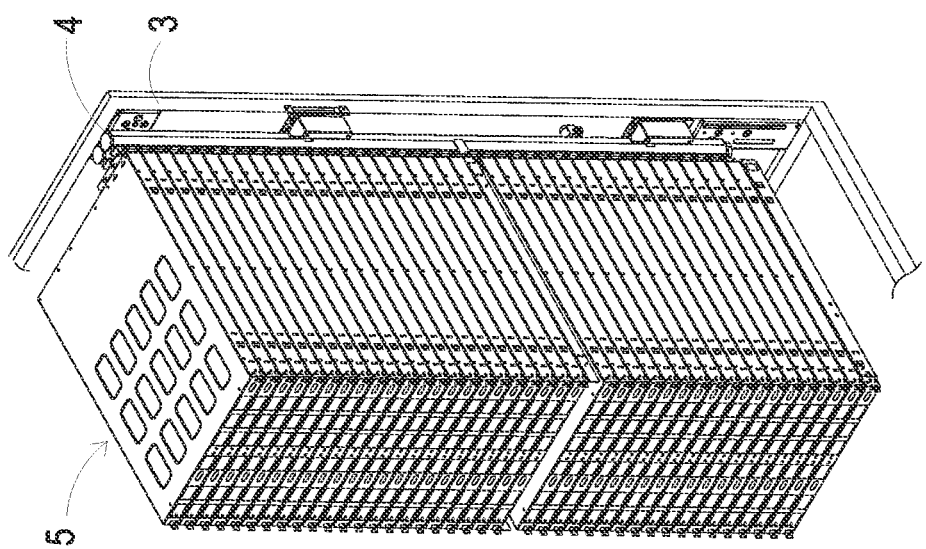
FIG. 3 is a schematic perspective view showing a rack-mount server system with a liquid cooling system according to an embodiment of the present disclosure.
Figure 4:
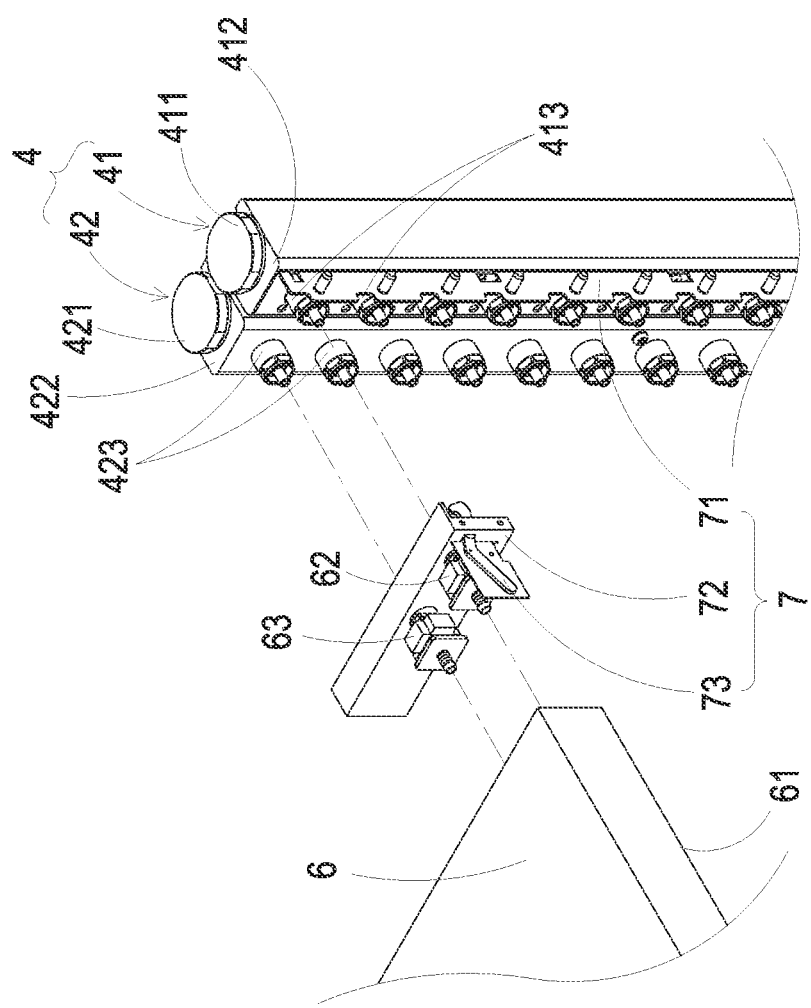
FIG. 4 is an exploded view showing a latch mechanism, a server and a manifold assembly of the rack-mount server system of FIG. 3.
Figure 5:
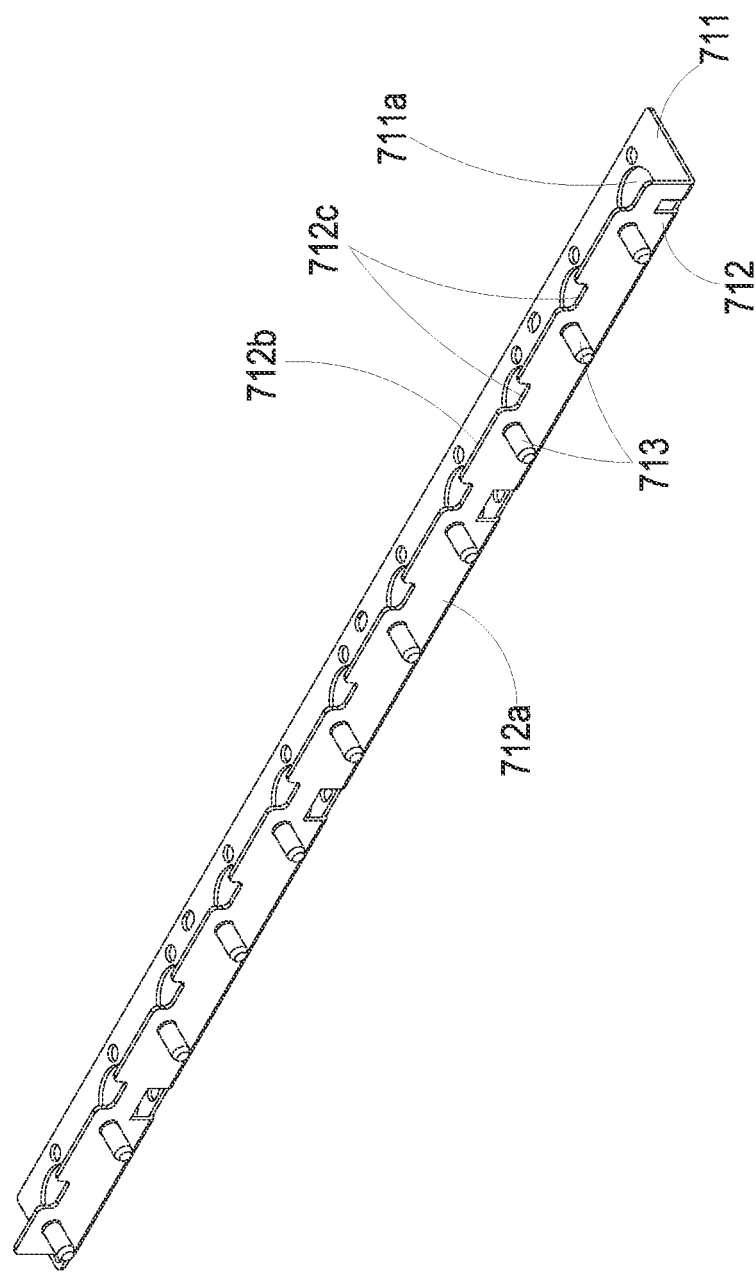
FIG. 5 is a schematic perspective view showing a fixing member of the latch mechanism of FIG. 4.
Figure 6:
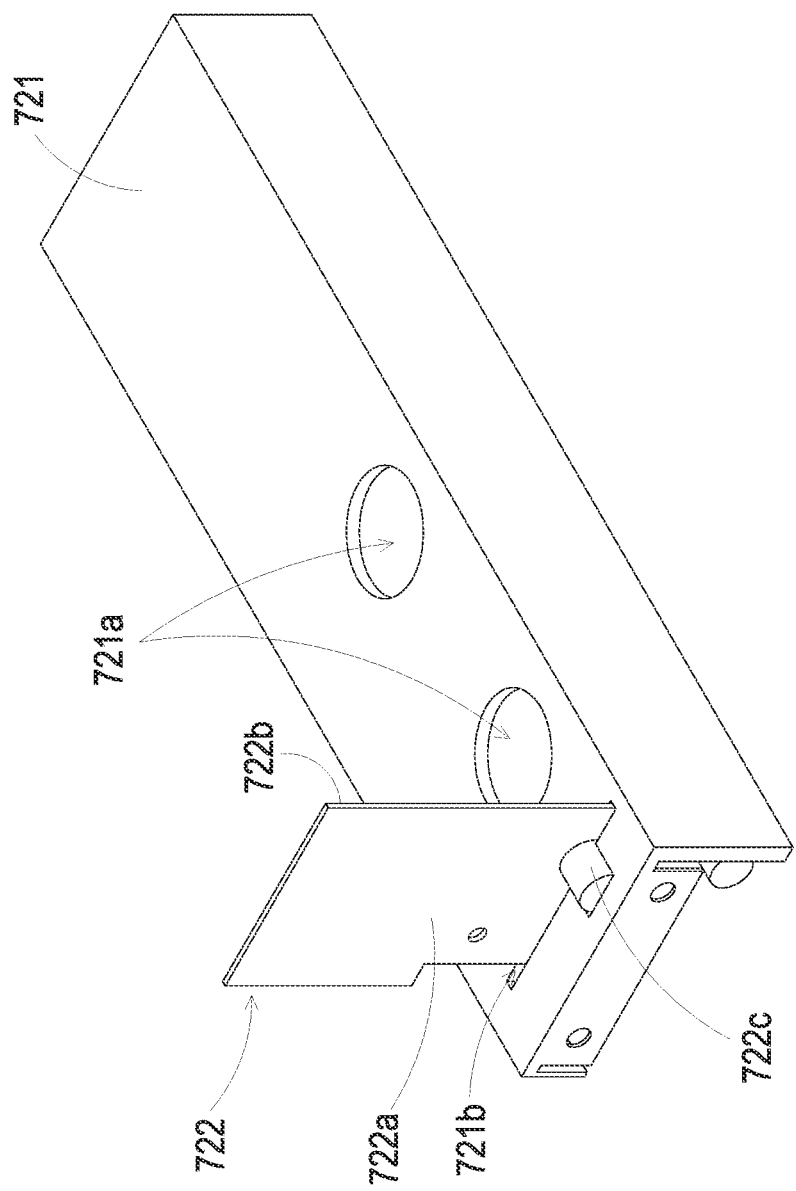
FIG. 6 is a schematic perspective view showing a fixing frame of the latch mechanism of FIG. 4.
Figure 7A:
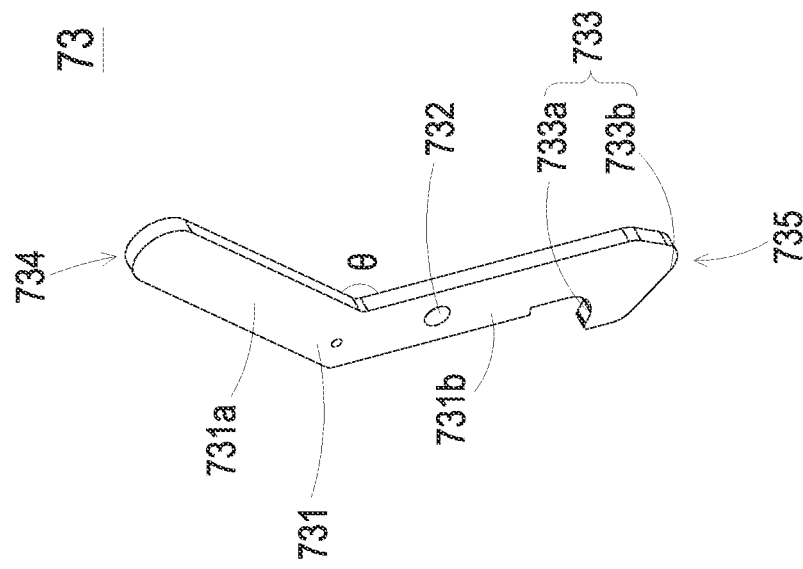
FIG. 7A is a schematic perspective view showing a hook member of the latch mechanism of FIG. 4.
Figure 7B:
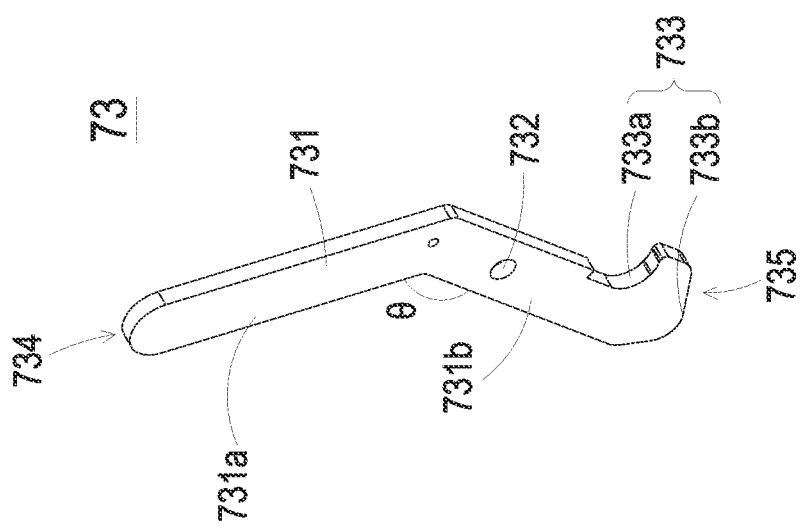
FIG. 7B is another schematic perspective view showing the hook member of the latch mechanism of FIG. 4.

FIG. 3 is a schematic perspective view showing a rack-mount server system with a liquid cooling system according to an embodiment of the present disclosure. FIG. 4 is an exploded view showing a latch mechanism, a server and a manifold assembly of the rack-mount server system of FIG. 3. FIG. 5 is a schematic perspective view showing a fixing member of the latch mechanism of FIG. 4. FIG. 6 is a schematic perspective view showing a fixing frame of the latch mechanism of FIG. 4. FIG. 7A is a schematic perspective view showing a hook member of the latch mechanism of FIG. 4. FIG. 7B is another schematic perspective view showing the hook member of the latch mechanism of FIG. 4. As shown in FIGS. 3 to 6, 7A and 7B, the rack-mount server system 2 of the present disclosure includes a rack 3, a manifold assembly 4, a server assembly 5 and a pump (not shown). The server assembly 5 includes at least one server 6 and a latch mechanism 7. In an embodiment, the server 6 and the latch mechanism 7 of the server assembly 5 are two independent devices, but not limited thereto. At least one liquid cooling loop is formed among the pump, the at least one server 6 of the server assembly 5 and the manifold assembly 4. The pump is configured to drive the cooling liquid to flow and circulate within the liquid cooling loop.

The rack 3 includes at least one slot (not shown), and the at least one server 6 is detachably disposed in the at least one slot of the rack 3. The manifold assembly 4 is detachably disposed on the rack 3. The manifold assembly 4 is not limited to vertically or horizontally mount on the rear of the rack 3. The manifold assembly 4 includes a first manifold 41 and a second manifold 42. The first manifold 41 includes one or a plurality of first manifold connectors 413, and the second manifold 42 includes one or a plurality of second manifold connectors 423. The server 6 includes a casing 61, a first fluid connector 62 and a second fluid connector 63. The first fluid connector 62 and the second fluid connector 63 are disposed on the rear of the casing 61 and adjacent to each other. The latch mechanism 7 includes a fixing member 71, a fixing frame 72 and a hook member 73. The fixing member 71 is disposed on the first manifold 41 and includes at least one fixing pin 713 (shown in FIG. 5). The fixing frame 72 is secured to the rear of the casing 61 of the server 6 and includes a shaft 722c (shown in FIG. 6). The hook member 73 is rotatably disposed on the shaft 722c of the fixing frame 72 and includes a hook portion 733 (shown in FIGS. 7A and 7B). By rotating the hook portion 733 of the hook member 73 of the latch mechanism 7 to latch with the fixing pin 713 of the fixing member 71, the fixing frame 72 and fixing member 71 are secured with each other, and the first fluid connector 62 and the second fluid connector 63 are firmly coupled to and in fluid communication with the first manifold connector 413 of the first manifold 41 and the second manifold connector 423 of the second manifold 42, respectively. Consequently, the elastic force between the server 6 and the manifold assembly 4 are offset, the torque exerted upon the server 6 is reduced, uneven flow rate, leakage and poor circulation of the cooling liquid caused by the oblique of the server 6 in the slot of the rack 3 are avoided, the precision of the product is enhanced, and the heat dissipating efficiency is enhanced.

In the present embodiment, the first manifold 41 is disposed on the rear of the rack 3. The first manifold 41 includes a first conduit 411 and a first mounting platform 412. The first conduit 411 allows the cooling liquid to flow therein. The first mounting platform 412 is connected to a side of the first conduit 411. The at least one first manifold connector 413 is disposed on the first mounting platform 412 and in fluid communication with the first conduit 411. In the embodiment, the first manifold 41 includes a plurality of first manifold connectors 413. The plurality of first manifold connectors 413 are disposed on the first mounting platform 412 and spaced apart with each other at a specific interval. In an embodiment, the first manifold 41 is an inlet manifold, and the first fluid connector 62 is an inlet fluid connector, but not limited thereto. The first manifold connector 413 of the first manifold 41 is configured to couple with the first fluid connector 62 of the server 6, so that the cooling liquid in the first manifold 41 allows to flow into the liquid cooling channel (not shown) of the sever 6 through the first manifold connector 413 and the first fluid connector 62.

In the present embodiment, the second manifold 42 is disposed on the rear of the rack 3 and adjacent to the first manifold 41. The first manifold 41 and the second manifold 42 are connected to each other and arranged in parallel, but not limited thereto. The second manifold 42 includes a second conduit 421 and a second mounting platform 422. The second conduit 421 allows the cooling liquid to flow therein. The second mounting platform 422 is connected to a side of the second conduit 421. The at least one second manifold connector 423 is disposed on the second mounting platform 422 and in fluid communication with the second conduit 421. In the embodiment, the second manifold 42 includes a plurality of second manifold connectors 423 disposed on the second mounting platform 422 and spaced apart with each other at a specific interval. In an embodiment, the second manifold 42 is an outlet manifold and the second fluid connector 63 is an outlet fluid connector, but not limited thereto. The second manifold connector 423 of the second manifold 42 is configured to couple with the second fluid connector 63 of the server 6, so that the cooling liquid can be discharged from the liquid cooling channel of the server 6 to the second manifold 42 through the second fluid connector 63 and the second manifold connector 423.

In the embodiment, the server 6 includes a circuit board (not shown) and a liquid cooling channel (not shown). The circuit board is disposed in the interior of the casing 61 and includes a plurality of electronic components. The liquid cooling channel is disposed in the interior of the casing 61 and has two ends connected with the first fluid connector 62 and the second fluid connector 63, respectively, and allows the cooling liquid to flow therein. The cooling liquid in the first manifold 41 flows into the liquid cooling channel of the sever 6 through the first manifold connector 413 and the first fluid connector 62, and discharges from the liquid cooling channel of the server 6 to the second manifold 42 through the second fluid connector 63 and the second manifold connector 423, therefore, the liquid cooling circulation is performed. Under this circumstance, heat exchange between the cooling liquid and the electronic components of the server 6 is performed to transfer thermal energy away from the server 6 continuously. Consequently, heat dissipation of the server 6 is achieved.

Alternatively, in some embodiments, the first manifold 41 is an outlet manifold and the first fluid connector 62 is an outlet fluid connector, and the second manifold 42 is an inlet manifold and the second fluid connector 63 is an inlet fluid connector. Preferably but not exclusively, the first fluid connector 62, the second fluid connector 63, the first manifold connector 413 and the second manifold connector 423 are quick-disconnecting fluid connectors.

Please refer to FIGS. 3 to 5. The fixing member 71 of the latch mechanism 7 is fixed on the first mounting platform 412 of the first manifold 41. The fixing member 71 includes a first substrate 711, a first supporting plate 712 and at least one fixing pin 713. The first substrate 711 is fixed on the first mounting platform 412 of the first manifold 41 and includes at least one first through hole 711a. In the embodiment, the first substrate 711 has a plurality of first through holes 711a which are spaced apart with each other at a specific interval. Each of the first manifold connectors 413 of the first manifold 41 penetrates through the corresponding one of the first through holes 711a and exposed to the surface of the first substrate 711. The first supporting plate 712 is connected to the first substrate 711. In the embodiment, the longitudinal edge of the first supporting plate 712 is connected to the longitudinal edge of the first substrate 711, and the first supporting plate 712 is vertical to the first substrate 711, but not limited thereto. The first supporting plate 712 has a first surface 712a and a second surface 712b. The first surface 712a and the second surface 712b are two opposed surfaces, and the first surface 712a is at a position away from the first substrate 711. The at least one fixing pin 713 is disposed on the first surface 712a of the first supporting plate 712. In the embodiment, the fixing member 71 includes a plurality of fixing pins 713 disposed on the first supporting plate 712, arranged linearly, and spaced apart with each other at a specific interval. Each of the plurality of fixing pins 713 is aligned to the corresponding one of the plurality of first manifold connectors 413.

As shown in FIGS. 3 to 6, 7A and 7B, the fixing frame 72 includes a second substrate 721 and a second supporting plate 722. The second substrate 721 of the fixing frame 72 is secured to the rear of the casing 61 of the server 6. The second substrate 721 includes two second through hole 721a and an opening 721b. The first fluid connector 62 and the second fluid connector 63 penetrates through the second through holes 721a respectively and exposed to an external surface of the second substrate 721. The opening 721b is penetrated through the second substrate 721 and configured for allowing the hook member 73 to penetrate therethrough and rotate therein. The second supporting plate 722 is connected to the second substrate 721, vertical to the second substrate 721, and disposed adjacent to the opening 721b. The second supporting plate 722 includes a first surface 722a, a second surface 722b and a shaft 722c. The first surface 722a and the second surface 722b are two opposed surfaces, and the first surface 722a is away from the second substrate 721. The shaft 722c is disposed on the first surface 722a of the second supporting plate 722.

Please refer to FIGS. 3 to 6 and FIGS. 7A to 7B. The hook member 73 is rotatably disposed on the first surface 722a of the second supporting plate 722 and configured to latch with the corresponding one of the plurality of fixing pins 713, so that the latch mechanism 7 is able to fix the first fluid connector 62 and the second fluid connector 63 of the server 6 to the first manifold connector 413 of the first manifold 41 and the second manifold connector 423 of the second manifold 42 firmly. In an embodiment, the hook member 73 includes a rod 731, a shaft opening 732 and a hook portion 733. The rod 731 includes a first section 731a and a second section 731b, and an angle θ is formed between the first section 731a and the second section 731b. The angle θ has a specific angle, and the specific angle is an obtuse angle. The shaft opening 732 penetrates through the hook member 73 and located at a middle portion of the hook member 73. In an embodiment, the shaft opening 732 is disposed at the second section 731b. The hook portion 733 is disposed at second end 735 of the second section 731b of the hook member 73 and configured to latch with the corresponding one of the plurality of fixing pins 713 of the fixing member 71. The second end 735 is opposite to a first end 734. The hook portion 733 has an accommodating part 733a and an inclined part 733b. The accommodating part 733a is an arc-shaped recess located at a first edge of the hook portion 733 and configured for accommodating and fixing the corresponding one of the plurality of fixing pins 713 of the fixing member 71 therein. The inclined part 733b is a curved surface located at a second edge of the hook portion 733 and configured for allowing the corresponding one of the plurality of fixing pins 713 of the fixing member 71 to be guided into the accommodating part 733a. The hook member 73 is rotatably disposed on the first surface 722a of the second supporting plate 722, and the hook portion 733 of the hook member 73 penetrates through the opening 721b of the second substrate 721 of the fixing frame 72. In an embodiment, the shaft 722c of the second supporting plate 722 penetrates through the shaft opening 732 of the hook member 73, so that the hook member 73 is rotatably coupled to the second supporting plate 722 of the fixing frame 72.

Figure 8A:
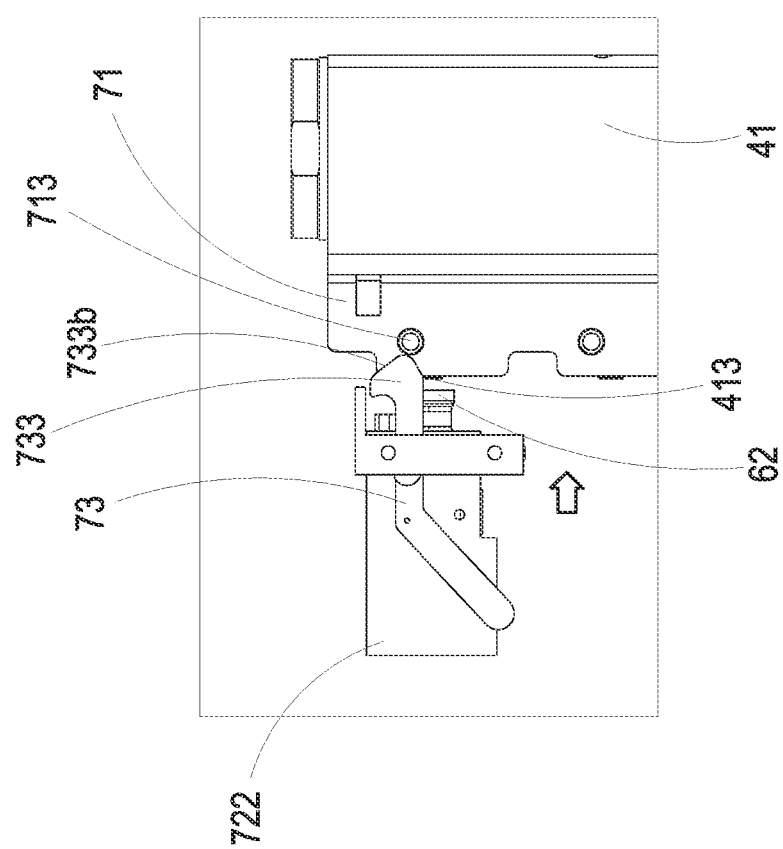
FIGS. 8A to 8C are schematic cross-sectional views illustrating the actions of the latch mechanism, the fluid connectors of the server, the manifold connectors of the manifold assembly according to the embodiment of the present disclosure.
Figure 8B:
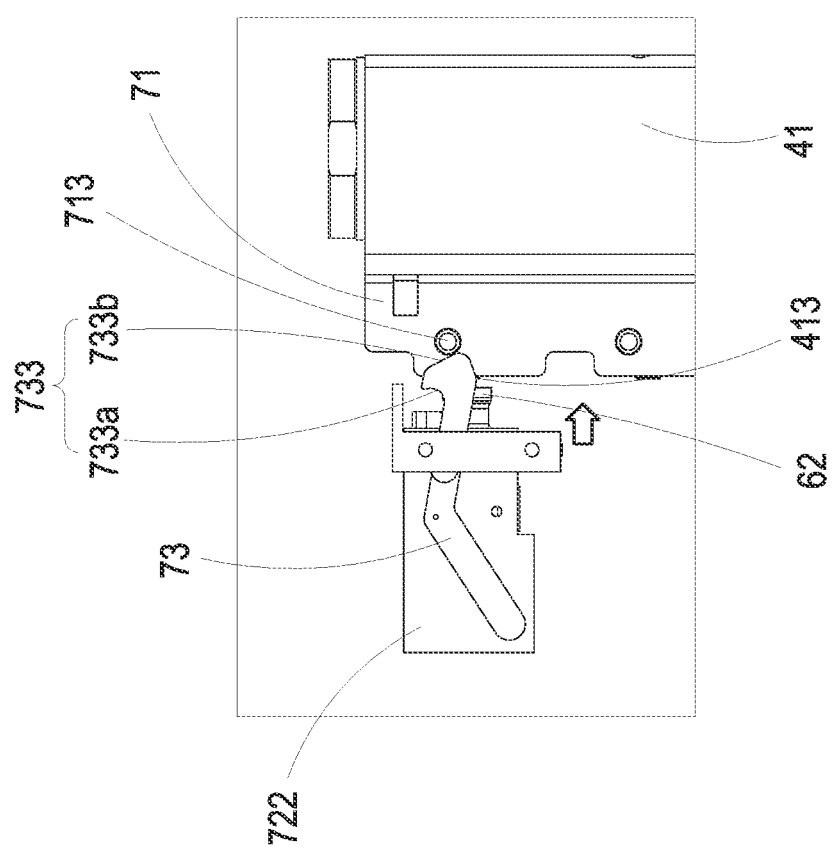
Figure 8C:
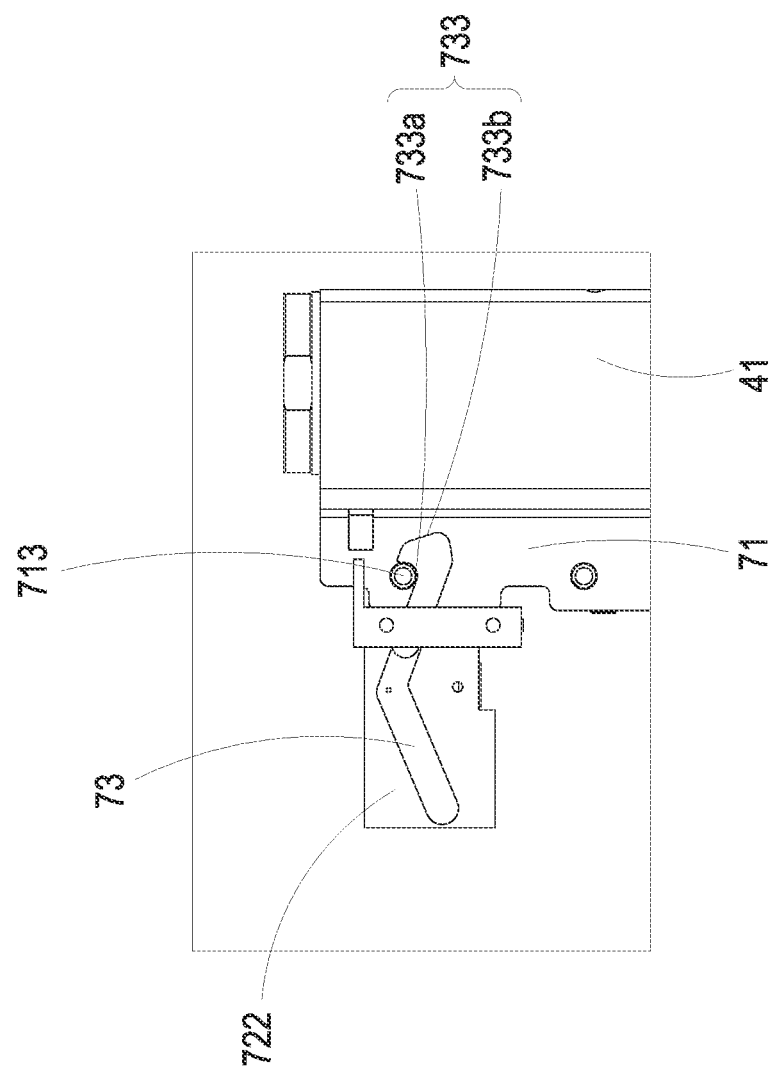

FIGS. 8A to 8C are schematic cross-sectional views illustrating the actions of the latch mechanism, the fluid connectors of the server, the manifold connectors of the manifold assembly according to the embodiment of the present disclosure. As shown in FIGS. 3 to 6, FIGS. 7A to 7B and FIG. 8A, firstly, when the server 6 is installed into the slot of the rack 3, the first fluid connector 62 and the second fluid connector 63 of the server 6 are moved toward the first manifold connector 413 of the first manifold 41 and the second manifold connector 423 of the second manifold 42, respectively. Meanwhile, the fixing pin 713 of the fixing member 71 contacts with the inclined part 733b of the hook portion 733 of the hook member 73. Then, as shown in FIG. 8B, the first fluid connector 62 and the second fluid connector 63 of the server 6 are continuously moved toward the first manifold connector 413 of the first manifold 41 and the second manifold connector 423 of the second manifold 42, and the fixing pin 713 abuts against the hook member 73 and pushes the hook portion 733 along the inclined part 733b, so that the hook member 73 is rotated around the shaft 722c as axis. Finally, as shown in FIG. 8C, the first fluid connector 62 and the second fluid connector 63 of the server 6 are coupled to the first manifold connector 413 of the first manifold 41 and the second manifold connector 423 of the second manifold 42 respectively, and the fixing pin 713 crosses over the inclined part 733b of the hook member 73 and is accommodated in and fixed to the accommodating part 733a of the hook member 73. By the latching action between the hook member 73 and the fixing pin 713 of the fixing member 71 disposed on the first manifold 41, the latch mechanism 7 can fix the first fluid connector 62 and the second fluid connector 63 of the server 6 to the first manifold connector 413 of the first manifold 41 and the second manifold connector 423 of the second manifold 42 firmly, and the first fluid connector 62 and the second fluid connector 63 of the server 6 are in fluid communication with the first manifold connector 413 of the first manifold 41 and the second manifold connector 423 of the second manifold 42, respectively.

In an embodiment, the other longitudinal edge of the first supporting plate 712 has a plurality of recesses 712c. The plurality of recesses 712c are spaced apart with each other at a specific interval. Any two of the neighboring recesses 712c are configured for accommodating the two opposite sides of the second substrate 721 of the fixing frame 72, so as to secure the fixing frame 72 between the two neighboring recesses 712c.

From the above descriptions, the present disclosure provides a latch mechanism, a server assembly and a rack-mount server system employing the same. The latching mechanism is configured to fix fluid connectors of the server to manifold connectors of a manifold assembly firmly, so that the elastic force exerted between the server and the manifold assembly is offset, the torque exerted upon the server is reduced, the oblique of the server in the slot of a rack and the leakage of the cooling liquid are avoided, the precision of the product is enhanced, and the heat dissipating efficiency is enhanced.

While the disclosure has been described in terms of what is presently considered to be the most practical and preferred embodiments, it is to be understood that the disclosure needs not be limited to the disclosed embodiment.

What is claimed is:

1. A latch mechanism, applied to a rack-mount server system, wherein the rack-mount server system comprises at least one server and at least one manifold, the at least one server comprises a casing and at least one fluid connector, the at least one manifold comprises at least one manifold connector, wherein the latch mechanism comprises:
    at least one fixing member disposed on the at least one manifold and comprising at least one fixing pin;
    a fixing frame secured to the server and comprising a shaft; and
    a hook member rotatably disposed on the shaft of the fixing frame and comprising a hook portion,
    wherein, by rotating the hook portion of the hook member to latch with the at least one fixing pin of the at least one fixing member, the fixing frame and fixing member are secured with each other, and the at least one fluid connector of the at least one server is firmly coupled to and in fluid communication with the at least one manifold connector of the at least one manifold,
    wherein the fixing frame comprises a second substrate and a second supporting plate, wherein the second substrate secured to the server and comprising at least one second through hole and an opening, wherein the at least one fluid connector of the server penetrates through the at least one second through hole, and the opening is configured for allowing the hook member to penetrate therethrough and rotate therein, wherein the second supporting plate is vertically connected to the second substrate and penetrates through the opening, wherein the shaft is disposed on the second supporting plate.

2. The latch mechanism according to claim 1, wherein the fixing member comprises:
    a first substrate fixed on the manifold and comprising at least one first through hole; and
    a first supporting plate vertically connected to the first substrate;
    wherein the at least one fixing pin is disposed on the first supporting plate, and the at least one manifold connector of the manifold penetrates through the corresponding one of the at least one first through hole.

3. The latch mechanism according to claim 2, wherein the hook member comprises:
    a rod having a first section and a second section, wherein an angle is formed between the first section and the second section; and
    a shaft opening located at a middle portion of the hook member, wherein the shaft of the second supporting plate penetrates through the shaft opening of the hook member, so that the hook member is rotatably coupled to the second supporting plate.

4. The latch mechanism according to claim 1, wherein the hook portion has an accommodating part and an inclined part, wherein the accommodating part is an arc-shaped recess located at a first edge of the hook portion and configured for accommodating and fixing the at least one fixing pin, wherein the inclined part is a curved surface located at a second edge of the hook portion and configured for allowing the at least one fixing pin to be guided into the accommodating part.

5. The latch mechanism according to claim 4, wherein when the at least one server is moved toward the manifold, the at least one fixing pin of the fixing member contacts with the inclined part of the hook portion of the hook member, wherein when the at least one server is continuously moved toward the manifold, the at least one fixing pin abuts against the hook member and pushes the hook portion along the inclined part, so that the hook member is rotated around the shaft as axis, wherein when the at least one fluid connector of the server is coupled to the at least one manifold connector of the manifold, the at least one fixing pin crosses over the inclined part of the hook member and is accommodated in and fixed to the accommodating part of the hook member.

6. A server assembly, applied to a rack-mount server system, wherein the rack-mount server system comprises at least one manifold, and the at least one manifold comprises at least one manifold connector, wherein the server assembly comprises:
    at least one server comprising a casing and at least one fluid connector, wherein the at least one fluid connector is disposed on a side of the casing; and
    a latch mechanism comprising:
        at least one fixing member disposed on the at least one manifold and comprising at least one fixing pin;
        a fixing frame secured to the casing of the server and comprising a shaft; and
        a hook member rotatably disposed on the shaft of the fixing frame and comprising a hook portion,
    wherein, by rotating the hook portion of the hook member to latch with the at least one fixing pin of the at least one fixing member, the fixing frame and fixing member are secured with each other, and the at least one fluid connector of the at least one server is firmly coupled to and in fluid communication with the at least one manifold connector of the at least one manifold,
    wherein the fixing frame comprises a second substrate and a second supporting plate, wherein the second substrate secured to the server and comprising at least one second through hole and an opening, wherein the at least one fluid connector of the server penetrates through the at least one second through hole, and the opening is configured for allowing the hook member to penetrate therethrough and rotate therein, wherein the second supporting plate is vertically connected to the second substrate and penetrates through the opening, wherein the shaft is disposed on the second supporting plate.

7. A rack-mount server system, comprising:
a rack;
a manifold assembly detachably disposed on the rack and comprising at least one manifold, wherein the at least one manifold comprises at least one manifold connector;
at least one server detachably disposed in the rack and comprising a casing and at least one fluid connector, wherein the at least one fluid connector is disposed on a side of the casing; and
a latch mechanism comprising:
at least one fixing member disposed on the at least one manifold and comprising at least one fixing pin;
a fixing frame secured to the casing of the server and comprising a shaft; and
a hook member rotatably disposed on the shaft of the fixing frame and comprising a hook portion,
wherein, by rotating the hook portion of the hook member to latch with the at least one fixing pin of the at least one fixing member, the fixing frame and fixing member are secured with each other, and the at least one fluid connector of the at least one server is firmly coupled to and in fluid communication with the at least one manifold connector of the at least one manifold,
wherein the fixing frame comprises a second substrate and a second supporting plate, wherein the second substrate secured to the server and comprising at least one second through hole and an opening, wherein the at least one fluid connector of the server penetrates through the at least one second through hole, and the opening is configured for allowing the hook member to penetrate therethrough and rotate therein, wherein the second supporting plate is vertically connected to the second substrate and penetrates through the opening, wherein the shaft is disposed on the second supporting plate.

8. The rack-mount server system according to claim 7, wherein the at least one manifold comprises a conduit and a mounting platform, and the mounting platform is connected to the conduit, wherein the at least one manifold connector is disposed on the mounting platform and in fluid communication with the conduit.

9. The rack-mount server system according to claim 7, wherein the fixing member of the latch mechanism comprises:
a first substrate fixed on the manifold and comprising at least one first through hole; and
a first supporting plate vertically connected to the first substrate;
wherein the at least one fixing pin is disposed on the first supporting plate, and the at least one manifold connector of the manifold penetrates through the corresponding one of the at least one first through hole.

10. The rack-mount server system according to claim 9, wherein the hook member comprises:
a rod having a first section and a second section, wherein an angle is formed between the first section and the second section; and
a shaft opening located at a middle portion of the hook member, wherein the shaft of the second supporting plate penetrates through the shaft opening of the hook member, so that the hook member is rotatably coupled to the second supporting plate.

11. The rack-mount server system according to claim 7, wherein the hook portion has an accommodating part and an inclined part, wherein the accommodating part is an arc-shaped recess located at a first edge of the hook portion and configured for accommodating and fixing the at least one fixing pin, wherein the inclined part is a curved surface located at a second edge of the hook portion and configured for allowing the at least one fixing pin to be guided into the accommodating part.

12. The rack-mount server system according to claim 11, wherein when the at least one server is moved toward the manifold, the at least one fixing pin of the fixing member contacts with the inclined part of the hook portion of the hook member, wherein when the at least one server is continuously moved toward the manifold, the at least one fixing pin abuts against the hook member and pushes the hook portion along the inclined part, so that the hook member is rotated around the shaft as axis, wherein when the at least one fluid connector of the server is coupled to the at least one manifold connector of the manifold, the at least one fixing pin crosses over the inclined part of the hook member and is accommodated in and fixed to the accommodating part of the hook member.

* * * * *